May 26, 1959 F. G. HERRING 2,888,648

TRANSISTOR REACTANCE DEVICE

Filed March 31, 1954

United States Patent Office 2,888,648

Patented May 26, 1959

2,888,648

TRANSISTOR REACTANCE DEVICE

Frederick G. Herring, Wantagh, N.Y., assignor to Hazeltine Research, Inc., Chicago, Ill., a corporation of Illinois Application March 31, 1954, Serial No. 420,225

12 Claims. (Cl. 332—16)

*General*

The present invention is directed to transistor reactance devices and, more particularly, to such devices which are operative to develop a controllable reactance at a frequency which may be substantially greater than the highest frequency at which the transistor is capable of amplifying an applied signal. Such devices are particularly useful as reactance modulators for controlling or modulating the frequency of an oscillator, or for controlling the mean operating frequency of an amplifier or its pass band. For convenience, the invention will be described in connection with an oscillator.

For some applications, such as in the automatic frequency control of an oscillator, it is desirable that a transistor reactance device have a high input impedance to the control or the modulating signal. Prior transistor reactance devices have had relatively low input impedances whereas much higher input impedances to the control signal may sometimes be more desirable.

Transistors have been employed as reactance devices for controlling the frequency of oscillators operating in a frequency range below 1 megacycle. In some instances, however, transistors have been utilized to control the frequency of an oscillator, the upper frequency limit of which is about 4 megacycles. The transistor has not proved particularly successful as an amplifier for signals above 4 megacycles and it heretofore has been felt that the transistor could not be successfully used above that frequency as a variable reactance device. Likewise, the sensitivity and the linearity of prior transistor reactance devices have not been as great as has been desired for some applications and furthermore have undesirably amplitude-modulated the signal of the oscillator controlled thereby.

It is an object of the invention to provide a new and improved transistor reactance device which avoids one or more of the above-mentioned disadvantages and limitations of such prior applications.

It is also an object of the present invention to provide a new and improved transistor reactance device having a high input impedance to control or modulating signals utilized to control the frequency of the frequency-determining circuit of of an oscillator or amplifier.

It is a further object of the invention to provide a new and improved frequency-modulation system which is characterized by its linearity of operation and absence of undesired amplitude modulation.

It is yet another object of the invention to provide a new and improved transistor reactance device which is capable of modulating an oscillator operating at frequencies in the megacycle range and which is characterized by its low power consumption.

In accordance with a particular form of the invention, a transistor reactance device operative to develop a controllable reactance comprises a body having two portions separated by an intermediate portion of semiconductive material presenting a space-charge region about the junctions of those portions. The device also includes ohmic emitter and collector connections to the aforesaid two portions and an ohmic base connection to the intermediate portion. There is also included circuit means for supplying at least one bias voltage in the reverse direction between the emitter and base connections and between the collector and base connections whereby the body has at the junctions of the portions between the collector and emitter connections a pair of reactances effectively coupled in series. The transistor reactance device additionally includes means for applying a control voltage between the base connection and the emitter and collector connections to develop at the aforesaid junctions a variation of the series-connected reactances related to the magnitude of the control voltage. Output circuit means are coupled between the collector and emitted connections for translating the aforesaid reactance variation.

For a better understanding of the present invention, together with other and further objects thereof, reference is had to the following description taken in connection with the accompanying drawing, and its scope will be pointed out in the appended claims.

Referring to the drawing.

Figure 1:
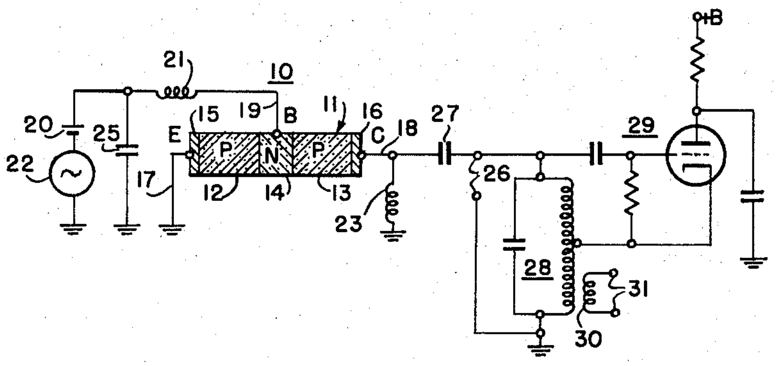
Fig. 1 is a circuit diagram of a transistor reactance device in accordance with one form of the present invention for controlling the frequency of an oscillator associated therewith.

*Description of transistor reactance device of Fig. 1*

Referring now, more particularly, to Fig. 1 of the drawing, there is represented a transistor reactance device 10 that is operative to develop a controllable reactance which, for some applications, may be for application to electrical apparatus, to be described subsequently, that is operating at a frequency considerably above the signal-amplification frequency range of a transistor. The device comprises a body 11 having two portions 12 and 13 separated by an intermediate portion 14 of semiconductive material such as germanium presenting a space-charge region about the junctions of the portions. The two portions 12 and 13 of the body 11 may, for example be of semiconductive material of one electrical conductivity type while the intermediate portion 14 is of the opposite conductivity type. Accordingly, the body 11 may comprise P-N-P types of germanium or may comprise N-P-N types of that material. The transistor represented for consideration in Fig. 1 is a P-N-P type junction transistor. It will be understood that the transistor may be one of the grown-junction type, the alloy-junction type, or other suitable junction-type transistors. The terminology "space-charge region about the junctions of the portions of the semiconductive body" as employed in the text and the claims refers to the barrier region or the electrical barrier constituting a high-resistance interfacial zone or condition between contacting semiconductors of opposite conductivity types or between a semiconductor and a metallic conductor whereby current passes with ease in one direction and with relative difficulty in the other direction.

Opposite ends of the body 11 are provided with suitable means such as thin metallic coatings 15 and 16 for making low-resistance or ohmic electrical contact with the P-type layers. A similar coating or a drop of an electrolyte (not shown) may form the terminal for the thinner intermediate N-type layer 14. Ohmic emitter and collector connections 17 and 18 are connected to the respective portions 12 and 13 through the respective coatings 15 and 16 while an ohmic base connection 19 is connected to the intermediate portion 14. The emitter connection is connected directly to a point of fixed potential or ground.

The transistor reactance device further includes circuit means including a first device presenting a high impedance in the megacycle region and a low impedance in the audio-frequency range for supplying at least one bias voltage in the reverse direction between the emitter and base connections 17 and 19, respectively, and including a second device presenting a high impedance in the megacycle range and a low impedance in the audio-frequency range for supplying a bias voltage in the reverse direction between the collector and base connections 18 and 19, respectively, whereby the body 11 has at the junctions of the portions between the emitter and collector connections a pair of reactances comprising capacitances effectively coupled in series. By being biased in the reverse direction, it is meant that the transistor is biased in its direction of poor-current conductivity. This circuit means comprises a suitable voltage source such as a battery 20 having its positive terminal connected to the base connection 19 through the aforesaid first device which constitutes a radio-frequency choke coil 21 and having its negative terminal connected to ground through a control-voltage source such as an audio-frequency generator 22. The grounded terminal of the generator 22 is also connected to the collector connection 18 through the aforesaid second device or radio-frequency choke coil 23. The battery 20 is connected in circuit with such polarity that a reverse bias with reference to the base electrode is applied to both the emitter and collector electrodes of the semiconductive body 11. It will be clear to those skilled in the art that if an N-P-N type junction transistor is employed, the polarity of the battery 20 would be reversed from that represented in Fig. 1 in order to supply the desired reverse bias to the semiconductive body. A radio-frequency by-pass condenser 25 is connected to ground between the junction of the choke coil 21 and the battery 20.

The transistor reactance device additionally includes means for supplying through the radio-frequency choke coil 21 a control voltage between the base connection 19 and the respective emitter and collector connections 17 and 18 to develop at the junctions of the body 11 a variation of the series-connected capacitances related to the magnitude of the control voltage. For some applications, such as in automatic-frequency-control systems, this control voltage may be a unidirectional voltage of controllable or adjustable magnitude. However, the transistor reactance device under consideration is represented as employing a periodic control voltage which is in the audio-frequency range and is supplied by the generator 22. This periodic voltage supplied by the generator 22 preferably has a maximum amplitude much less than the magnitude of the bias voltage supplied by the battery 20 and may, for example, be not greater than one-tenth of the magnitude of the aforesaid bias voltage.

The transistor reactance device 10 also includes output circuit means coupled between the collector and emitter connections. This means may comprise a pair of terminals 26, 26, one of which is connected to the collector connection 18 through a coupling condenser 27 and the other of which is grounded. This output circuit means may additionally include a tuned circuit 28 such as that of a conventional Hartley oscillator 29 which may be resonant at a relatively low frequency or at a frequency above the signal-amplification frequency of a transistor. For example, the means operating frequency of the oscillator may be substantially 150 megacycles as compared with the maximum signal-amplification frequency of about 4 megacycles of a transistor. A frequency-modulated output signal may be taken from output terminals

31, 31 of a winding 30 inductively coupled to the inductor of the tuned circuit 28.

*Explanation of operation of transistor reactance device of Fig. 1*

Considering now the operation of the transistor reactance device of Fig. 1, the reverse direction bias supplied by the battery 20 between the emitter and base connections affects the space-charge layer or region that is in the vicinity of the junctions of the portions 12 and 14 and develops an internal capacitance in that region. Since the reverse direction bias is also supplied by the battery 20 between the collector and base connections, it similarly affects the space-charge region at the junctions of the portions 14 and 13 and develops an internal capacitance in the region. These capacitances are, in the order named, represented by the condensers $C_e$ and $C_c$ in the equivalent circuit diagram of Fig. 2 wherein it will be seen that the condensers are in series relation. The dielectric constant of these condensers is equal to that of the semiconductor such as germanium. The magnitude of the emitter and collector biases developed by the battery 20, which is common to the emitter and collector circuits, may be considered physically to control the dimensions of the two space-charge regions mentioned above. An increase in the reverse direction bias increases the dimension or thickness of the space-charge region and produces the effect of a condenser having an increase in the spacing between electrodes corresponding to the increase in the thickness of that space-charge layer or region. Thus, an increase in the reverse direction bias results in a decrease in the capacitances of the condensers $C_e$ and $C_c$. Conversely, a decrease in such bias decreases the dimensions of the space-charge region and increases the capacitance of the condenser corresponding to that space-charge region. The condensers or capacitances $C_e$ and $C_c$ existing at the junctions of the portions 12, 14, and 13 are shunted by internal resistances $R_e$ and $R_c$ which, because of the reverse direction biases, have high values which may be found to be of the order of 500 kilohms to 5 megohms. Insofar as the output circuit including the terminals 26, 26 of the reactance device 10 is concerned, the condensers $C_e$ and $C_c$ may, therefore, be considered as substantially pure capacitances.

Figure 2:
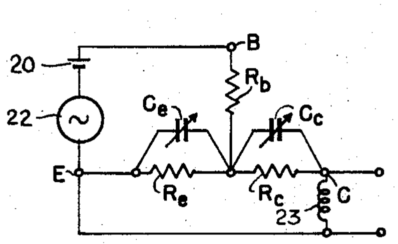
Fig. 2 is an equivalent circuit diagram of the transistor reactance device of Fig. 1.

The application of a control signal by the generator 22 varies the magnitude of the reverse direction biases on the emitter and collector electrodes of the transistor device 10 and simultaneously varies the magnitude of the capacitances $C_e$ and $C_c$ represented in Fig. 2. When the control signal is a periodic voltage such as an audio-frequency signal having an amplitude much less than the magnitude of the bias voltage supplied by the battery 20, for example, not greater than one-tenth of the magnitude thereof, there is developed at the junctions of the portions 12, 14, and 13 a variation of the series-connected capacitances $C_e$ and $C_c$ which is a linear function of the magnitude of that control voltage. These capacitances are coupled by the condenser 27 and the emitter connection 17 across the tuned circuit 28 of the oscillator 29 and are effective in the well-known manner to modify the resonant frequency of the oscillator, thereby producing a frequency-modulated output signal at the output terminals 31, 31 of the oscillator. The radio-frequency choke coil 23 possesses a high impedance to ground to signals of the frequency of the oscillator 29 and, because of the choke coil 21, the base electrode of the transistor is effectively open-circuited to such signals. The condenser 25 serves to by-pass to ground signals of the oscillator frequency. It has been determined in some applications of the device 10 that the condensers $C_e$ and $C_c$ produced at the junctions of the portions 12, 14, and 13 have capacitances of the order of 20 to 100 micromicrofarads. It has also been found that the capacitances $C_e$ and $C_c$ have values inversely proportional to a minor fractional power of the effective bias voltage applied to the electrodes of the transistor device 10. These capacitances in farads may be expressed as a constant of the order of 12 x $12^{-12}$ times the minor fractional power of the effective bias voltage, this minor fractional power being between one-third and one-half depending on the particular transistor being employed. The resultant output capacitance of the transistor follows this same law.

The body 11 has an impedance which may be over 250 kilohms between its emitter and base connections 17 and 19 with reference to a control voltage in the audio-frequency range supplied by the generator 22. This impedance is made up of the internal base resistance $R_b$ represented in Fig. 2 in series with the parallel combination of the resistors $R_e$ and $R_c$. For some transistors of the type under consideration, the resistance $R_b$ may be of the order of 5 kilohms and the effective input impedance of the transistor to a signal in the modulating frequency may be between 250 kilohms and 2.5 megohms. This input impedance is very high compared to that presented by a conventional transistor input circuit which ordinarily has an input impedance of about 1 kilohm. A very high input impedance is ordinarily desirable when the transistor device 10 is employed in an automatic-frequency-control system. In such an application, the audio-frequency generator 22 would be replaced by a source of variable unidirectional potential. If the amplitude of a modulation signal supplied by the generator 22 is small compared to the quiescent collector and emitter voltages, the variation in the output capacitance of the transistor reactance device, and thus the variation of the frequency of the oscillator 29, is a linear function of the modulating signal.

Since the transistor reactance device 10 has its emitter and collector electrodes biased in the reverse direction, the direct-current power which is required to operate the device is very small. With the 6-volt biasing battery 20 in the circuit of one such device, the total power consumption was as low as 100 microwatts. The device 10, therefore, features a high input impedance, low power consumption, and the capability of developing a controllable capacitance for application to a tuned circuit which may be resonant at a frequency in a very high frequency range considerably above the highest frequency at which a transistor has heretofore been capable of translating an applied signal. The transistor reactance device 10 is also characterized by its good sensitivity and linearity of operation.

Figure 3:
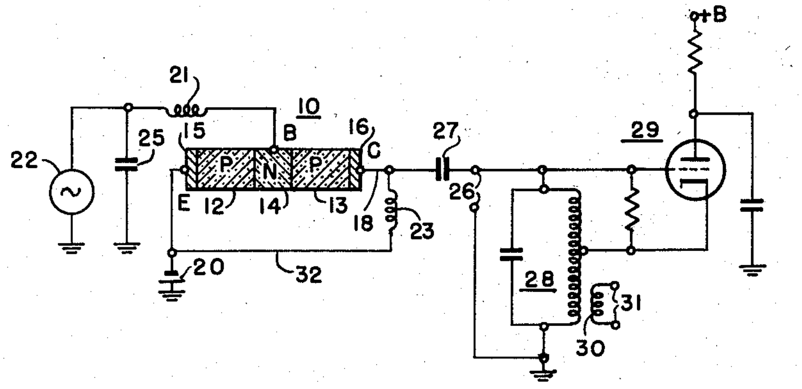
Fig. 3 is a circuit diagram of a transistor reactance device in accordance with a modified form of the invention and an oscillator which is controlled thereby.

*Description of transistor reactance device of Fig. 3*

Referring now to Fig. 3 of the drawing, there is represented a transistor reactance device which is generally similar to that represented in Fig. 1. Accordingly, corresponding elements are designated by the same reference numerals. The device of Fig. 3 differs from that of Fig. 1 in that it eliminates the floating bias supply of Fig. 1 by orienting the battery so that the positive terminal thereof is connected directly to ground. To this end, the emitter connection is connected to the negative terminal of the battery 20 and is also connected through a conductor 32 and the radio-frequency choke coil 23 to the collector connection 18. This connection of the bias supply to the emitter and collector electrodes of the transistor permits the use of a conventional rectifier-type power supply which ordinarily has one terminal thereof connected to ground. The operation of the transistor reactance device 10 of Fig. 3 is the same as that of the Fig. 1 device and, therefore, need not be repeated.

While applicant does not wish to be limited to any particular set of circuit constants, the following circuit constants have proved to be useful in a transistor reactance modulator system of the type represented in Fig. 1:

| | |
|---|---|
| Transistor **10** | Raytheon Type CK–722. |
| Condenser **25** | 100 micromicrofarads. |
| Condenser **27** | 4.7 micromicrofarads. |
| Choke coils **21, 23** | 26 microhenries. |
| Battery **20** | 6 volts. |
| R.M.S. voltage of generator **22** | 0.6 volt. |
| Mean frequency of oscillator **29** | About 40 megacycles. |
| Frequency deviation | 0 to 25 kilocycles. |
| Variation in output capacitance of device **10** | Approximately 7 to 8.4 micromicrofarads. |
| Power consumption | About 100 microwatts. |

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A transistor reactance device operative to develop a controllable reactant comprising: a body having two portions separated by an intermediate portion of semiconductive material presenting a space-charge region about the junctions of said portions; ohmic emitter and collector connections to said two portions and an ohmic base connection to said intermediate portion; circuit means for supplying at least one bias voltage in the reverse direction between said emitter and base connections and between said collector and base connections whereby said body has at the junctions of said portions between said collector and emitter connections a pair of reactances effectively coupled in series; means for applying a control voltage between said base connection and said emitter and collector connections to develop at said junctions a variation of said series-connected reactances related to the magnitude of said control voltage; and output circuit means coupled between said collector and emitter connections for translating said reactance variation.

2. A transistor reactance device operative to develop a controllable reactance comprising: a body having two portions of semiconductive material of one conductivity type separated by an intermediate portion of semiconductive material of the opposite type presenting a space-charge region about the junctions of said portions; ohmic emitter and collector connections to said two portions and a single ohmic base connection to said intermediate portion; circuit means for supplying a bias voltage in the reverse direction between said emitter and base connections and between said collector and base connections whereby said body has at the junctions of said portions between said collector and emitter connections a pair of reactances effectively coupled in series; means for applying a control voltage between said base connection and said emitter and collector connections to develop at said junctions a variation of said series-connected reactances related to the magnitude of said control voltage; and output circuit means coupled between said collector and emitter connections for translating said reactance variation.

3. A transistor reactance device operative to develop a controllable capacitance comprising: a body having two portions separated by an intermediate portion of semiconductive material presenting a space-charge region about the junctions of said portions; ohmic emitter and collector connections to said two portions and a single ohmic base connection to said intermediate portion; circuit means for supplying at least one bias voltage in the reverse direction between said emitter and base connections and between said collector and base connections whereby said body has at the junctions of said portions between said collector and emitter connections a pair of capacitances effectively coupled in series; means for applying a control voltage between said base connection and said emitter and collector connections to develop at said junctions a variation of said series-connected capacitances related to the magnitude of said control voltage; and output circuit means coupled between said collector and emitter connections for translating said reactance variation.

4. A transistor reactance device operative to develop a controllable capacitance comprising: a body having two portions separated by an intermediate portion of semiconductive material presenting a space-charge region about the junctions of said portions; ohmic emitter and collector connections to said two portions and an ohmic base connection to said intermediate portion; circuit means for supplying a bias voltage in the reverse direction between said emitter and base connections and between said collector and base connections whereby said body has at the junctions of said portions between said collector and emitter connections a pair of capacitances effectively coupled in series and having a value inversely proportional to a fractional power of said bias voltage; means for applying a control voltage between said base connection and said emitter and collector connections to develop at said junctions a variation of said series-connected capacitances related to the magnitude of said control voltage; and output circuit means coupled between said collector and emitter connections for translating said reactance variation.

5. A transistor reactance device operative to develop a controllable reactance at a frequency above the signal-amplification frequency range of a transistor comprising: a body having two portions separated by an intermediate portion of semiconductive material presenting a space-charge region about the junctions of said portions; ohmic emitter and collector connections to said two portions, which connections are electrically independent of each other above said signal-amplification frequency range, and an ohmic base connection to said intermediate portion; circuit means for supplying at least one bias voltage in the reverse direction between said emitter and base connections and between said collector and base connections whereby said body has at the junctions of said portions between said collector and emitter connections a pair of reactances effectively coupled in series; means for applying a control voltage between said base connection and said emitter and collector connections to develop at said junctions a variation of said series-connected reactances related to the magnitude of said control voltage; and output circuit means, including a tuned circuit resonant at a frequency above said range and responsive to said reactance variation, coupled between said collector and emitter connections.

6. A transistor reactance device operative to develop a controllable reactance at a frequency which may be above the signal-amplification frequency range of a transistor comprising: a body having two portions separated by an intermediate portion of semiconductive material presenting a space-charge region about the junctions of said portions; ohmic emitter and collector connections to said two portions, which connections are electrically independent of each other above said signal-amplification frequency range, and an ohmic base connection to said intermediate portion; circuit means for supplying at least one bias voltage in the reverse direction between said emitter and base connections and between said collector and base connections whereby said body has at the junctions of said portions between said collector and emitter connections a pair of reactances effectively coupled in series and has an impedance of over 250 kilohms between said emitter and base connections to a control voltage in the audio-frequency range applied thereto; means for applying a control voltage in said audio-frequency range between said base connection and said emitter and collector connections to develop at said junctions a variation of said series-connected reactances related to the magnitude of said control voltage; and output circuit means coupled between said collector and emitter connections for translating said reactance variation.

7. A transistor reactance device operative to develop a controllable reactance at a frequency which may be above the signal-amplification frequency range of a transistor comprising: a body having two portions separated by an intermediate portion of semi-conductive material presenting a space-charge region about the junctions of said portions; ohmic emitter and collector connections to said two portions, which connections are electrically independent of each other above said signal-amplification frequency range, and an ohmic base connection to said intermediate portion; circuit means for supplying at least one bias voltage in the reverse direction between said emitter and base connections and between said collector and base connections whereby said body has at the junctions of said portions between said collector and emitter connections a pair of reactances effectively coupled in series and has an impedance of approximately 2.5 megohms between said emitter and base connections to a control voltage in the audio-frequency range applied thereto; means for applying a control voltage in said audio-frequency range between said base connection and said emitter and collector connections to develop at said junctions a variation of said series-connected reactances related to the magnitude of said control voltage; and output circuit means coupled between said collector and emitter connections for translating said reactance variation.

8. A transistor reactance device operative to develop a controllable reactance at a frequency which may be above the signal-amplification frequency range of a transistor comprising: a body having two portions separated by an intermediate portion of semiconductive material presenting a space-charge region about the junctions of said portions; ohmic emitter and collector connections to said two portions, which connections are electrically independent of each other above said signal-amplification frequency range, and an ohmic base connection to said intermediate portion; circuit means for supplying at least one bias voltage in the reverse direction between said emitter and base connections and between said collector and base connections whereby said body has at the junctions of said portions between said collector and emitter connections a pair of capacitances effectively coupled in series; means for applying between said base connection and said emitter and collector connections a periodic control voltage having an amplitude much less than the magnitude of said bias voltage to develop at said junctions a variation of said series-connected capacitances which is a linear function of the magnitude of said control voltage; and output circuit means coupled between said collector and emitter connections for translating said reactance variation.

9. A transistor reactance device operative to develop a controllable reactance at a frequency which may be above the signal-amplification frequency range of a transistor comprising: a body having two portions separated by an intermediate portion of semiconductive material presenting a space-charge region about the junctions of said portions; ohmic emitter and collector connections to said two portions, which connections are electrically independent of each other above said signal-amplification frequency range, and an ohmic base connection to said intermediate portion; circuit means including a first device presenting a high impedance in the megacycle range and a low impedance in the audio-frequency range for supplying a bias voltage in the reverse direction between said emitter and base connections and including a second device presenting a high impedance in the megacycle range and a low impedance in the audio-frequency range for supplying a bias voltage between said collector and base connections whereby said body has at the junctions of said portions between said collector and emitter connections a pair of reactances effectively coupled in series; means for applying through said first device a control voltage in said audio-frequency range between said base connection and said emitter and collector connections to develop at said junctions a variation of said series-connected reactances related to the magnitude of said control voltage; and output circuit means coupled between said collector and emitter connections for translating said reactance variation.

10. A transistor reactance device operative to develop a controllable reactance at a frequency above the signal-amplification frequency range of a transistor comprising: a body having two portions separated by an intermediate portion of semiconductive material presenting a space-charge region about the junctions of said portions; ohmic emitter and collector connections to said two portions, which connections are electrically independent of each other above said signal-amplification frequency range, and an ohmic base connection to said intermediate portion; circuit means including a first radio-frequency choke coil for supplying a bias voltage in the reverse direction between said emitter and base connections and including a second radio-frequency choke coil for supplying a bias voltage between said collector and base connections whereby said body has at the junctions of said portions between said collector and emitter connections a pair of reactances effectively coupled in series; means for applying through said first coil a control voltage in the audio-frequency range between said base connection and said emitter and collector connections to develop at said junctions a variation of said series-connected reactances related to the magnitude of said control voltage; and output circuit means coupled between said collector and emitter connections for translating said reactance variation.

11. A modulator system comprising: a body having two portions separated by an intermediate portion of semiconductive material presenting a space-charge region about the junctions of said portions; ohmic emitter and collector connections to said two portions and an ohmic base connection to said intermediate portion; circuit means for supplying at least one bias voltage in the reverse direction between said emitter and base connections and between said collector and base connections whereby said body has at the junctions of said portions between said collector and emitter connections a pair of reactances effectively coupled in series; and an oscilaltor including a tuned circuit resonant at a frequency above the signal-amplification frequency of a transistor and coupled between said collector and emitter connections; means for applying a control voltage between said base connection and said emitter and collector connections to develop at said junctions a variation of said series-connected reactances related to the magnitude of said control voltage, thereby to modulate the frequency of said oscillator.

12. A transistor reactance device operative to develop a controllable reactance over a wide range of frequencies which may be above the signal-amplification frequency range of a transistor comprising: a body having two portions separated by an intermediate portion of semi-conductive material presenting a space-charge region about the junctions of said portions; ohmic emitter and collector connections to said two portions, which connections are electrically independent of each other above said signal-amplification frequency range, and an ohmic base connection to said intermediate portion; a radio-frequency choke coil connecting said emitter and collector connections; circuit means including a voltage source and another radio-frequency choke coil for supplying a bias voltage in the reverse direction between said emitter and base connections and including said source and said first-mentioned coil for supplying said bias voltage between said collector and base connections whereby said body has at the junctions of said portions between said collector and emitter connections a pair of reactances effectively coupled in series; means for applying through said other coil a control voltage in the audio-frequency range between said base connection and said emitter and collector connections to develop at said junctions a variation of said series-connected reactances related to the magnitude of said control voltage; and output circuit means coupled between said collector and emitter connections for translating said reactance variation.

References Cited in the file of this patent

UNITED STATES PATENTS

| | | |
|---|---|---|
| 2,569,347 | Shockley | Sept. 25, 1951 |
| 2,570,939 | Goodrich | Oct. 9, 1951 |
| 2,570,978 | Pfann | Oct. 9, 1951 |
| 2,600,500 | Haynes et al. | June 17, 1952 |
| 2,744,970 | Shockley | May 8, 1956 |
| 2,771,584 | Thomas | Nov. 20, 1956 |